United States Patent
Takeda et al.

(10) Patent No.: US 10,033,157 B2
(45) Date of Patent: Jul. 24, 2018

(54) SURFACE-EMITTING SEMICONDUCTOR LASER, METHOD FOR PRODUCING THE SAME, SURFACE-EMITTING SEMICONDUCTOR LASER DEVICE, OPTICAL TRANSMISSION DEVICE, AND INFORMATION PROCESSING DEVICE

(71) Applicant: FUJI XEROX CO., LTD., Tokyo (JP)

(72) Inventors: Kazutaka Takeda, Kanagawa (JP); Junichiro Hayakawa, Kanagawa (JP); Akemi Murakami, Kanagawa (JP); Naoki Jogan, Kanagawa (JP); Takashi Kondo, Kanagawa (JP); Jun Sakurai, Kanagawa (JP)

(73) Assignee: FUJI XEROX CO., LTD., Minato-ku, Tokyo (JP)

( * ) Notice: Subject to any disclaimer, the term of this patent is extended or adjusted under 35 U.S.C. 154(b) by 233 days.

(21) Appl. No.: 14/810,601

(22) Filed: Jul. 28, 2015

(65) Prior Publication Data
US 2016/0064900 A1    Mar. 3, 2016

(30) Foreign Application Priority Data
Aug. 26, 2014  (JP) .................................. 2014-171319

(51) Int. Cl.
*H01S 5/183* (2006.01)
*H01S 5/022* (2006.01)
(Continued)

(52) U.S. Cl.
CPC ...... *H01S 5/18311* (2013.01); *H01S 5/18361* (2013.01); *H01S 5/02212* (2013.01);
(Continued)

(58) Field of Classification Search
CPC ............ H01S 5/18311; H01S 5/02212; H01S 5/02288; H01S 5/3432; H01S 5/18347;
(Continued)

(56) References Cited

U.S. PATENT DOCUMENTS 7,099,363 B2    8/2006   Otsubo
7,829,912 B2 *  11/2010  Johnson ................ H01L 29/201
                                                   257/101
(Continued)

FOREIGN PATENT DOCUMENTS

JP    2003-273459 A    9/2003
JP    2008-192733 A    8/2008
(Continued)

*Primary Examiner* — Xinning Niu
(74) *Attorney, Agent, or Firm* — Sughrue Mion, PLLC

(57) ABSTRACT

A surface-emitting semiconductor laser includes a first semiconductor multilayer film reflector, an active region, a second semiconductor multilayer film reflector, and a current confinement layer including an oxidized region formed by selective oxidation. The current confinement layer includes a first semiconductor layer having a relatively high Al content, a second semiconductor layer that is adjacent to the first semiconductor layer on an active-region side of the first semiconductor layer and has a lower Al content than the first semiconductor layer, and a composition-gradient layer adjacent to the first semiconductor layer on a side of the first semiconductor layer which is opposite to the active-region side. A portion of the composition-gradient layer which faces the first semiconductor layer has a lower Al content than the first semiconductor layer.

10 Claims, 9 Drawing Sheets

(51) Int. Cl.
   *H01S 5/30*      (2006.01)
   *H01S 5/343*     (2006.01)

(52) U.S. Cl.
   CPC ....... *H01S 5/02288* (2013.01); *H01S 5/18313* (2013.01); *H01S 5/18347* (2013.01); *H01S 5/18394* (2013.01); *H01S 5/3054* (2013.01); *H01S 5/3432* (2013.01)

(58) Field of Classification Search
   CPC . H01S 5/18394; H01S 5/3054; H01S 5/18313
   See application file for complete search history.

(56) References Cited

U.S. PATENT DOCUMENTS

| | | | |
|---|---|---|---|
| 7,881,354 B2 | 2/2011 | Yoshikawa et al. | |
| 2003/0174750 A1* | 9/2003 | Otsubo ................. | B82Y 20/00 372/45.01 |
| 2005/0025025 A1* | 2/2005 | Nomura ................. | G11B 7/127 369/112.01 |
| 2012/0020383 A1* | 1/2012 | Shimizu ............... | G02B 6/4214 372/45.01 |

FOREIGN PATENT DOCUMENTS

| | | |
|---|---|---|
| JP | 2009-206480 A | 9/2009 |
| JP | 2013-179319 A | 9/2013 |

\* cited by examiner

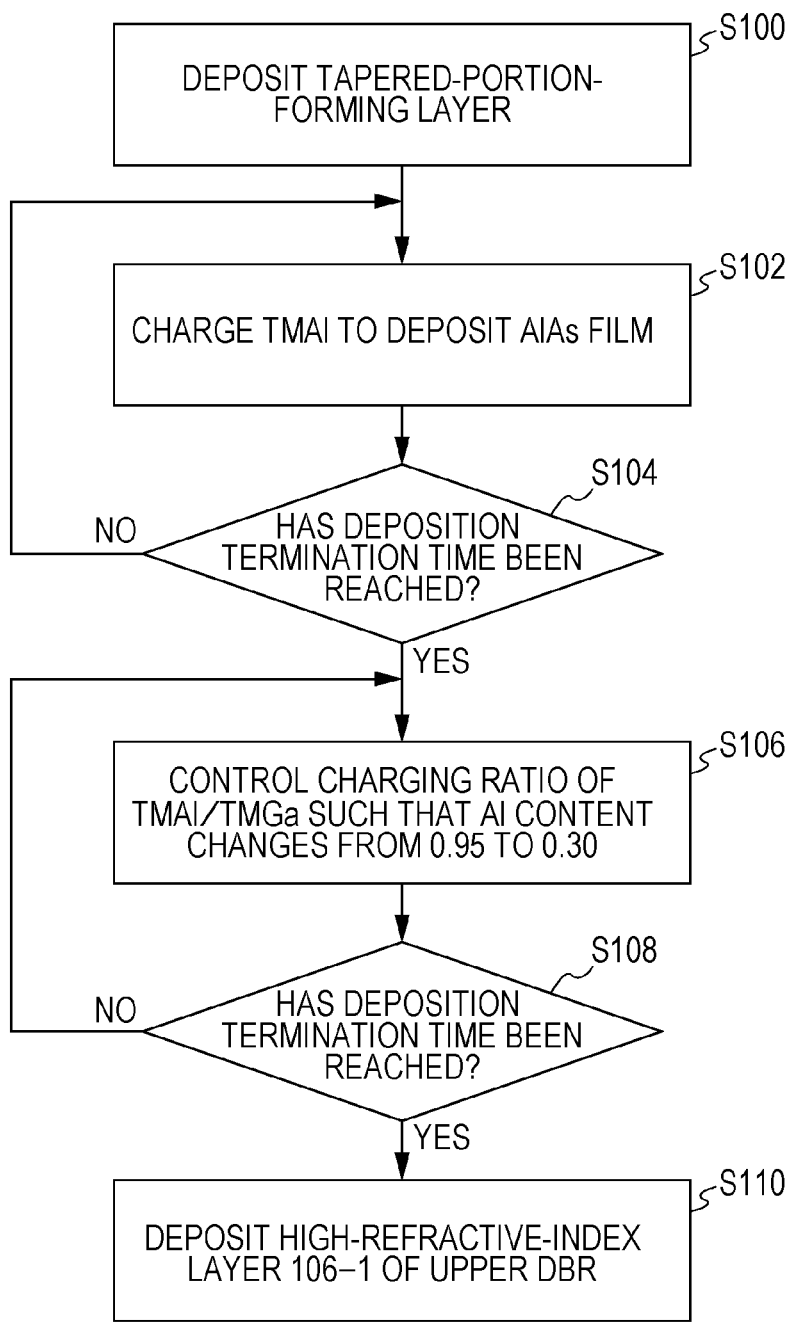

US 10,033,157 B2

SURFACE-EMITTING SEMICONDUCTOR LASER, METHOD FOR PRODUCING THE SAME, SURFACE-EMITTING SEMICONDUCTOR LASER DEVICE, OPTICAL TRANSMISSION DEVICE, AND INFORMATION PROCESSING DEVICE

CROSS-REFERENCE TO RELATED APPLICATIONS

This application is based on and claims priority under 35 USC 119 from Japanese Patent Application No. 2014-171319 filed Aug. 26, 2014.

BACKGROUND (i) Technical Field

The present invention relates to a surface-emitting semiconductor laser, a method for producing the surface-emitting semiconductor laser, a surface-emitting semiconductor laser device, an optical transmission device, and an information processing device.

(ii) Related Art

Surface-emitting semiconductor lasers are capable of emitting a laser beam in a direction perpendicular to the substrate and readily formed in an array by two-dimensional integration. Therefore, surface-emitting semiconductor lasers have been used as, for example, a light source for electronic equipment, such as a light source used for writing a latent image on a photoreceptor which is built in a printer, a light source for optical communications, or a light source for optical mice.

High-performance printers that offer high-speed, high-image-quality printing require single-mode (i.e., fundamental transverse mode) surface-emitting semiconductor lasers. In order to further improve image quality performance, development of surface-emitting semiconductor lasers having long service lives which have a large single-mode light output and achieve stable polarization are anticipated hereafter. Importance is also placed on controlling the angle of divergence of a laser beam in connection with the optical system constituting a printer.

SUMMARY

According to an aspect of the invention, there is provided a surface-emitting semiconductor laser including: a first semiconductor multilayer film reflector; an active region; a second semiconductor multilayer film reflector; and a current confinement layer including an oxidized region formed by selective oxidation. The current confinement layer includes a first semiconductor layer having a relatively high Al content, a second semiconductor layer adjacent to the first semiconductor layer, the second semiconductor layer being disposed on an active-region side of the first semiconductor layer, the second semiconductor layer having a lower Al content than the first semiconductor layer, and a composition-gradient layer adjacent to the first semiconductor layer, the composition-gradient layer being disposed on a side of the first semiconductor layer which is opposite to the active-region side on which the second semiconductor layer is disposed. A portion of the composition-gradient layer which faces the first semiconductor layer has a lower Al content than the first semiconductor layer.

BRIEF DESCRIPTION OF THE DRAWINGS

An exemplary embodiment of the present invention will be described in detail based on the following figures, wherein:

FIG. 2A illustrates the surface-emitting semiconductor laser that has not yet been oxidized and FIG. 2B illustrates the surface-emitting semiconductor laser that has been oxidized;

FIG. 7 illustrates a schematic flowchart of a process for producing a current confinement layer according to an exemplary embodiment of the invention;

DETAILED DESCRIPTION

Figure 1A:
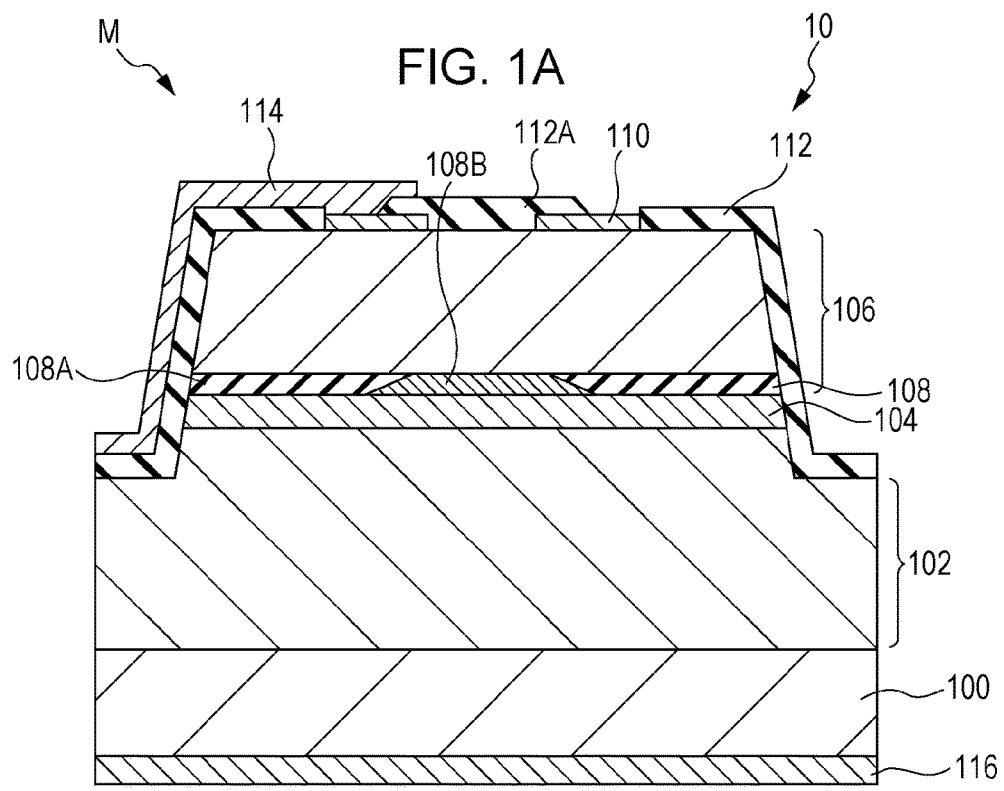
FIG. 1A is a schematic cross-sectional view of a surface-emitting semiconductor laser according to an exemplary embodiment of the invention.

An exemplary embodiment of the invention is described below with reference to the attached drawings. In the exemplary embodiment of the invention, a selective-oxidation-type surface-emitting semiconductor laser (i.e., vertical-cavity surface-emitting laser, VCSEL) including an oxidized region formed by selective oxidation is described as an example. Hereinafter, the surface-emitting semiconductor laser is referred to as "VCSEL". It should be noted that the drawings are scaled for ease of visualization of the features of the invention and the dimension of the device illustrated in the drawings is not always the same as that of the actual device.

Exemplary Embodiment

FIG. 1A is a schematic cross-sectional view of an example of a VCSEL according to an exemplary embodiment of the invention. As illustrated in FIG. 1A, a VCSEL 10 includes an n-type GaAs substrate 100; an n-type lower distributed Bragg reflector (hereinafter, abbreviated as "DBR") 102 stacked on the substrate 100, the lower DBR 102 including alternating pairs of a low-refractive-index layer and a highrefractive-index layer; an active region 104 stacked on the lower DBR 102; and a p-type upper DBR 106 stacked on the active region 104, the upper DBR 106 including alternating pairs of a low-refractive-index layer and a high-refractive-index layer. A cylindrical mesa (i.e., columnar structure) M that extends from the upper DBR 106 to the lower DBR 102 is formed above the substrate 100.

The lower DBR 102 is, for example, a multilayer body including plural types of layers, that is, an n-type $Al_{0.9}Ga_{0.1}As$ layer and an $Al_{0.3}Ga_{0.7}As$ layer. The thicknesses of these layers are each set to $\lambda/4n_r$, where $\lambda$ represents an oscillation wavelength and $n_r$ represents the refractive index of the medium. The lower DBR 102 includes 40.5 periods of alternating layers of $Al_{0.9}Ga_{0.1}As$ and $Al_{0.3}Ga_{0.7}As$. The lower DBR 102 is doped with silicon, which serves as an n-type impurity, such that the carrier concentration in the lower DBR 102 is $3\times10^{18}$ cm$^{-3}$.

The active region 104 includes upper and lower spacer layers and a quantum well active layer interposed therebetween. The lower spacer layer is, for example, an undoped $Al_{0.6}Ga_{0.4}As$ layer. The quantum well active layer includes, for example, an undoped $Al_{0.11}Ga_{0.89}As$ quantum well layer and an undoped $Al_{0.3}Ga_{0.7}As$ barrier layer. The upper spacer layer is, for example, an undoped $Al_{0.6}Ga_{0.4}As$ layer.

The upper DBR 106 is, for example, a multilayer body including p-type $Al_{0.9}Ga_{0.1}As$ layers and $Al_{0.3}Ga_{0.7}As$ layers. The thicknesses of these layers are each set to $\lambda/4n_r$, where $\lambda$ represents an oscillation wavelength and $n_r$ represents the refractive index in the medium. The upper DBR 106 includes about 20 to 30 periods of alternating layers of $Al_{0.9}Ga_{0.1}As$ and $Al_{0.3}Ga_{0.7}As$. The upper DBR 106 is doped with carbon, which serves as a p-type impurity, such that the carrier concentration in the upper DBR 106 is $3\times10^{18}$ cm$^3$. The top layer of the upper DBR 106 is a p-type GaAs contact layer. The carrier concentration in the contact layer is set to, for example, $1\times10^{19}$ cm$^{-3}$.

A current confinement layer 108 is disposed adjacent to the active region 104. The current confinement layer 108 also serves as the bottom layer of the upper DBR 106. The current confinement layer 108 includes p-type AlAs or AlGaAs. The current confinement layer 108 is constituted by an oxidized region 108A formed by selective oxidation performed in an oxidation step and a conductive region (i.e., oxidation aperture) 108B surrounded by the oxidized region 108A and thereby forms a current confinement structure. The oxidized region 108A has a lower refractive index than the conductive region 108B. Furthermore, the oxidized region 108A has a considerably high electric resistance. Therefore, the current confinement layer 108 enables both confinement of current and confinement of light to be achieved at a time.

A ring-shaped p-side electrode 110 composed of a Ti/Au laminated metal or the like is disposed on the upper DBR 106. A circular light-emitting aperture is formed at the center of the p-side electrode 110. The center of the light-emitting aperture is substantially aligned with the center of the conductive region 108B, that is, the optical axis. The p-side electrode 110 is electrically connected to the upper DBR 106. Carriers are injected into the upper DBR 106 through the p-side electrode 110.

An interlayer insulating film 112 is disposed so as to cover the bottom, the side surfaces, and the outer periphery of the top of the mesa M. The interlayer insulating film 112 is a dielectric film composed of SiN, SiON, SiO$_2$, or the like. A circular emission protection film 112A is disposed so as to cover the light-emitting aperture of the p-side electrode 110. The emission protection film 112A may be formed in the same step as the interlayer insulating film 112 or may be formed in a separate step.

A contact hole is formed between the interlayer insulating film 112 and the emission protection film 112A, and the p-side electrode 110 is exposed at the contact hole. A metal wire 114 is connected to the p-side electrode 110 through the contact hole. The metal wire 114 extends along the side surfaces and the bottom surface of the mesa M and is connected to an electrode pad or the like (not shown in the drawings). An n-side electrode 116 is disposed on the rear surface of the substrate 100.

Figure 2A:
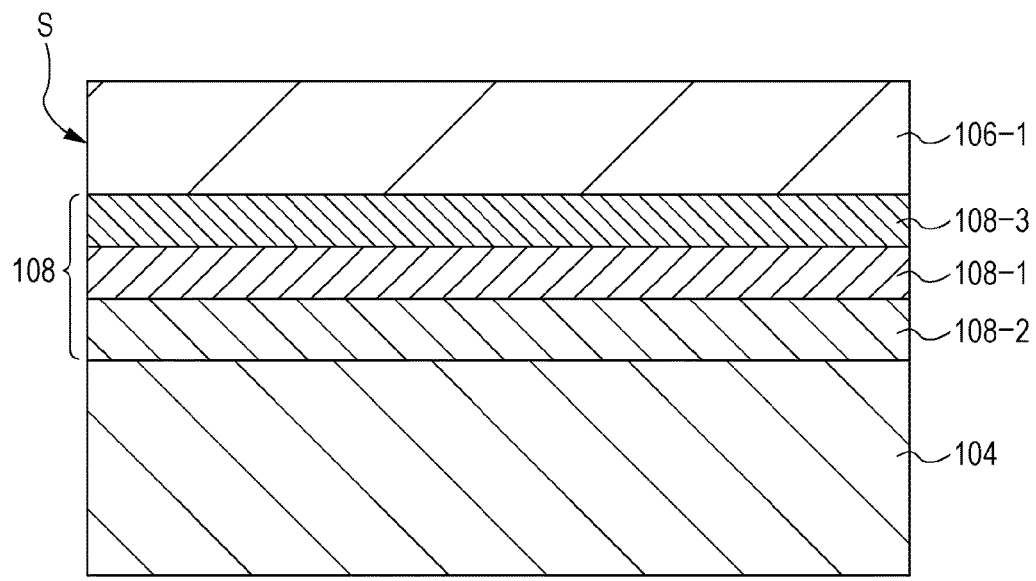
FIGS. 2A and 2B are enlarged cross-sectional views of a part of a surface-emitting semiconductor laser according to an exemplary embodiment of the invention which covers a current confinement layer, where
Figure 2B:
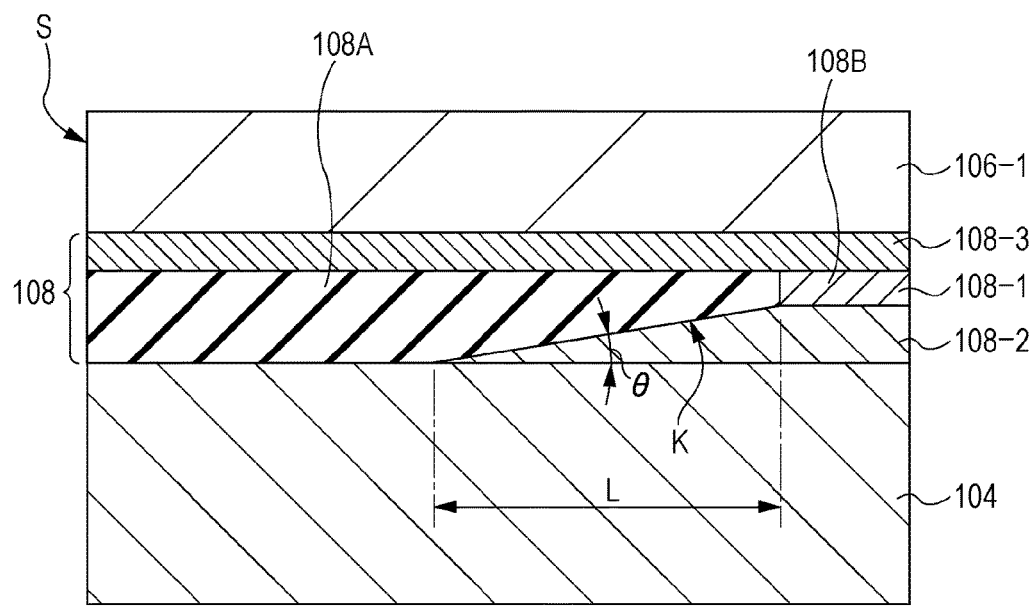

The current confinement layer of the VCSEL according to the exemplary embodiment is described in detail below. FIGS. 2A and 2B are enlarged cross-sectional views of a half of the mesa including the current confinement layer, where FIG. 2A illustrates the mesa that has not yet been oxidized and FIG. 2B illustrates the mesa that has been oxidized.

As illustrated in FIG. 2A, the current confinement layer 108 is interposed between an $Al_{0.3}Ga_{0.7}As$ high-refractive-index layer 106-1 constituting the upper DBR 106 and the active region 104. The current confinement layer 108 includes a high-oxidation-rate layer 108-1 having a relatively high oxidation rate, a tapered-portion-forming layer 108-2 disposed immediately below the high-oxidation-rate layer 108-1, and a composition-gradient layer 108-3 disposed on the high-oxidation-rate layer 108-1. The optical thickness of the current confinement layer 108, which includes the high-oxidation-rate layer 108-1, the tapered-portion-forming layer 108-2, and the composition-gradient layer 108-3, may be set to $\lambda/4$ in order to utilize the current confinement layer 108 as a low-refractive-index layer constituting the upper DBR 106.

The high-oxidation-rate layer 108-1 has the highest oxidation rate among the sublayers of the current confinement layer 108. In other words, the high-oxidation-rate layer 108-1 has the highest Al content. The high-oxidation-rate layer 108-1 may be composed of p-type AlAs. The high-oxidation-rate layer 108-1 may alternatively composed of AlGaAs having a high Al content, such as $Al_{0.98}Ga_{0.02}As$. The thickness Tc of the high-oxidation-rate layer 108-1 is preferably set smaller than the thickness of the tapered-portion-forming layer 108-2 and is more preferably set to 10 nm or more and 50 nm or less or about 10 nm or more and about 50 nm or less.

The tapered-portion-forming layer 108-2 is a layer having a lower Al content than the high-oxidation-rate layer 108-1 and may be composed of p-type AlGaAs. The Al content in the tapered-portion-forming layer, which is disposed immediately below the AlAs layer, may be set to 0.80 or more and 0.90 or less from the viewpoints of single-mode property and reliability.

The composition-gradient layer 108-3 is a p-type $Al_xGa_{1-x}As$ layer interposed between the high-refractive-index layer 106-1 of the upper DBR 106 and the high-oxidation-rate layer 108-1. The Al content (x) in the composition-gradient layer 108-3 gradually decreases in the direction from the high-oxidation-rate layer 108-1 to the high-refractive-index layer 106-1. The thickness of the composition-gradient layer 108-3 is substantially equal to or slightly smaller than the thickness of the high-oxidation-rate layer 108-1. In this exemplary embodiment, a portion of the composition-gradient layer 108-3 which faces the high-oxidation-rate layer 108-1 has a lower Al content than the high-oxidation-rate layer 108-1. In other words, the Al content in the high-oxidation-rate layer 108-1 differs from the maximum Al content in the composition-gradient layer 108-3 by a certain amount. That is, a discontinuity in Al content is formed at the boundary therebetween. The Al content in a portion of the composition-gradient layer 108-3 which faces the high-refractive-index layer 106-1 is set equal to the Al content in the high-refractive-index layer 106-1.

Figure 1B:
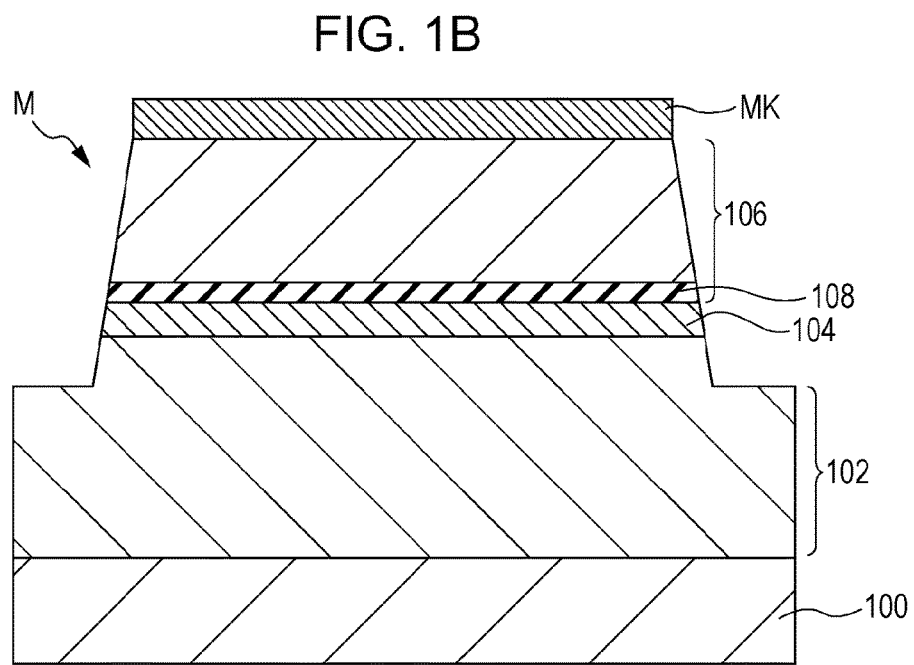
FIG. 1B is a schematic cross-sectional view of the surface-emitting semiconductor laser to be subjected to an oxidation treatment.

The current confinement layer illustrated in FIG. 2A is transformed into the current confinement layer illustrated in FIG. 2B by oxidation. Prior to the oxidation of the current confinement layer, a mask MK for etching is formed on the upper DBR 106 as illustrated in FIG. 1B, and a portion of a semiconductor layer which is exposed through the mask MK is removed by anisotropic etching to form a cylindrical mesa M. In this step, etching is performed at least until the current confinement layer 108 is exposed and may be performed until the lower DBR 102 is reached. Subsequent to the formation of the mesa M, the VCSEL 10 is oxidized in a nitrogen atmosphere containing water vapor in an oxidation furnace. The mask MK may be removed prior to the oxidation of the VCSEL 10.

In the oxidation step, a portion of the current confinement layer 108 which is exposed at the side surfaces S of the mesa M is oxidized as illustrated in FIG. 2B. Since the high-oxidation-rate layer 108-1 has the highest oxidation rate, oxidation proceeds deep in the high-oxidation-rate layer 108-1. Since the tapered-portion-forming layer 108-2 has a lower oxidation rate than the high-oxidation-rate layer 108-1, oxidation is terminated at a position shallower than the position at which the oxidation of the high-oxidation-rate layer 108-1 is terminated. As a result, a tapered (i.e., inclined) portion K having a tapered-portion length L and a tapering angle $\theta$ is formed at the boundary of the oxidized region 108A and the nonoxidized region inside the tapered-portion-forming layer 108-2.

Figure 3:
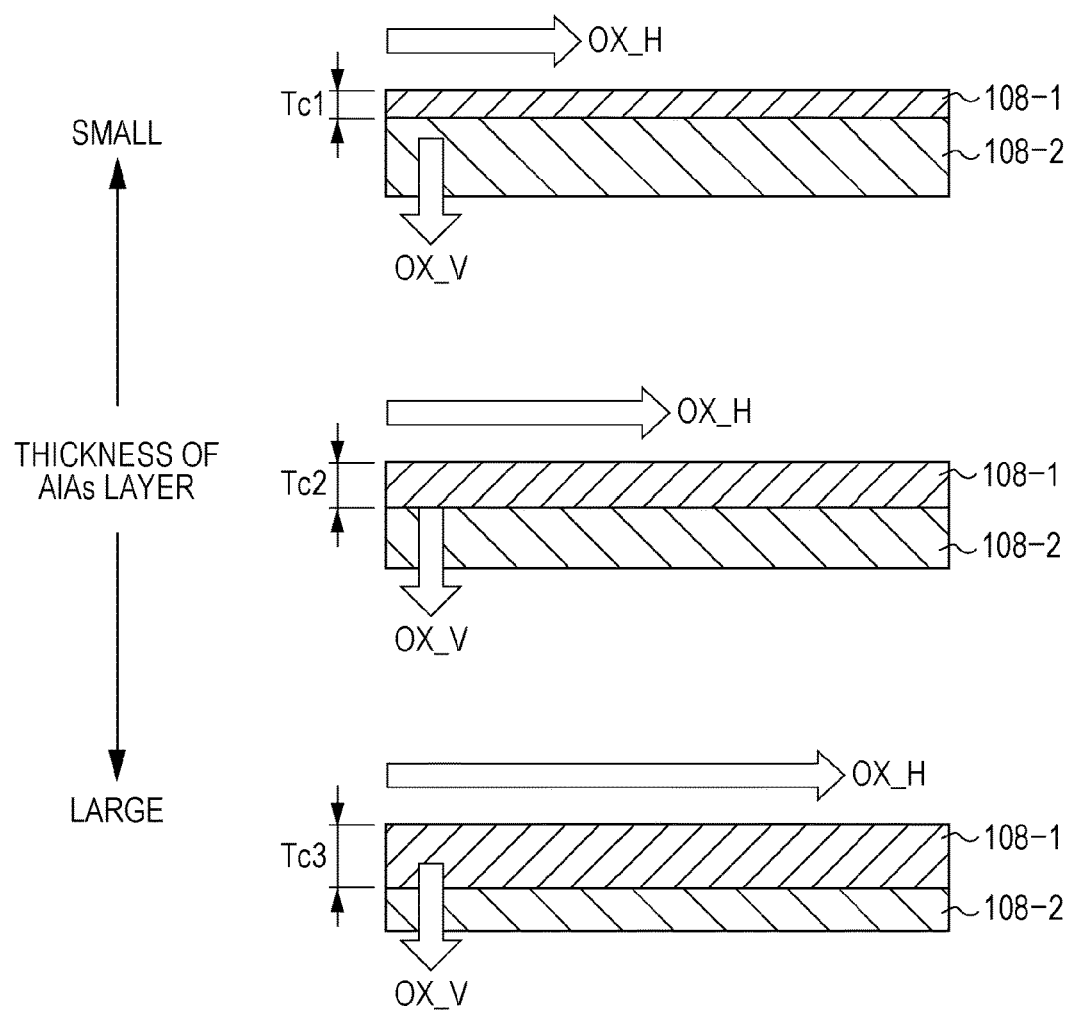
FIG. 3 is a diagram for explaining the thickness dependence of the horizontal oxidation rate in a current confinement layer.

FIG. 3 illustrates the relationship between the thickness of the high-oxidation-rate layer and the tapering angle when a multilayer structure including the high-oxidation-rate layer and the tapered-portion-forming layer is oxidized. In FIG. 3, OX_H represents the oxidation rate in the current confinement layer 108 in the horizontal direction, and OX_V represents the oxidation rate in the current confinement layer 108 in the vertical direction, that is, a direction in which the semiconductor layers are stacked. For the sake of explanatory simplicity, hereinafter, the high-oxidation-rate layer 108-1 is referred to as "AlAs layer" and the tapered-portion-forming layer 108-2 is referred to as "$Al_{0.85}Ga_{0.15}As$ layer".

The tapered portion K of the current confinement layer 108 is defined by the relationship between the horizontal oxidation rate OX_H in the AlAs layer 108-1 and the vertical oxidation rate OX_V at which oxidation proceeds in the direction from the AlAs layer to the $Al_{0.85}Ga_{0.15}As$ layer. In order to form a tapered portion K having a tapering angle $\theta$ of less than 90 degrees as illustrated in FIG. 2B, the horizontal oxidation rate OX_H needs to be higher than the vertical oxidation rate OX_V. However, if the horizontal oxidation rate OX_H is set excessively high, it becomes difficult to form a tapered portion in a region that contributes to the angle of divergence, that is, a region on which light is incident.

While the Al content in AlGaAs is the governing factor in determining the vertical oxidation rate OX_V, the horizontal oxidation rate OX_H is governed by not only the Al content in AlAs but also the thickness of AlAs. When the thickness Tc1 of the AlAs layer becomes relatively small as illustrated in FIG. 3, the horizontal oxidation rate OX_H becomes low. When the thickness Tc2 becomes larger than Tc1, the horizontal oxidation rate OX_H becomes higher than that corresponding to the thickness Tc1. When the thickness Tc3 becomes larger than Tc2, the horizontal oxidation rate OX_H becomes high accordingly.

Thus, when the vertical oxidation rate OX_V is constant, the higher the horizontal oxidation rate OX_H, the smaller the tapering angle $\theta$ of the tapered portion K. Conversely, the lower the horizontal oxidation rate OX_H, the larger the tapering angle $\theta$ of the tapered portion K. In other words, by changing the thickness of the AlAs layer, the horizontal oxidation rate OX_H can be changed accordingly, which enables the tapering angle $\theta$ to be controlled. For example, the tapering angle $\theta$ can be reduced by increasing the thickness of the AlAs layer. Conversely, the tapering angle $\theta$ can be increased by reducing the thickness of the AlAs layer.

While the horizontal oxidation rate OX_H can be reduced by reducing the thickness of the AlAs layer, if the horizontal oxidation rate OX_H becomes lower than the vertical oxidation rate OX_V, the tapering angle $\theta$ may exceed 90 degrees or it becomes difficult to form the tapered portion. Therefore, the thickness of the AlAs layer may be controlled such that the horizontal oxidation rate OX_H is higher than the vertical oxidation rate OX_V.

Figure 4:
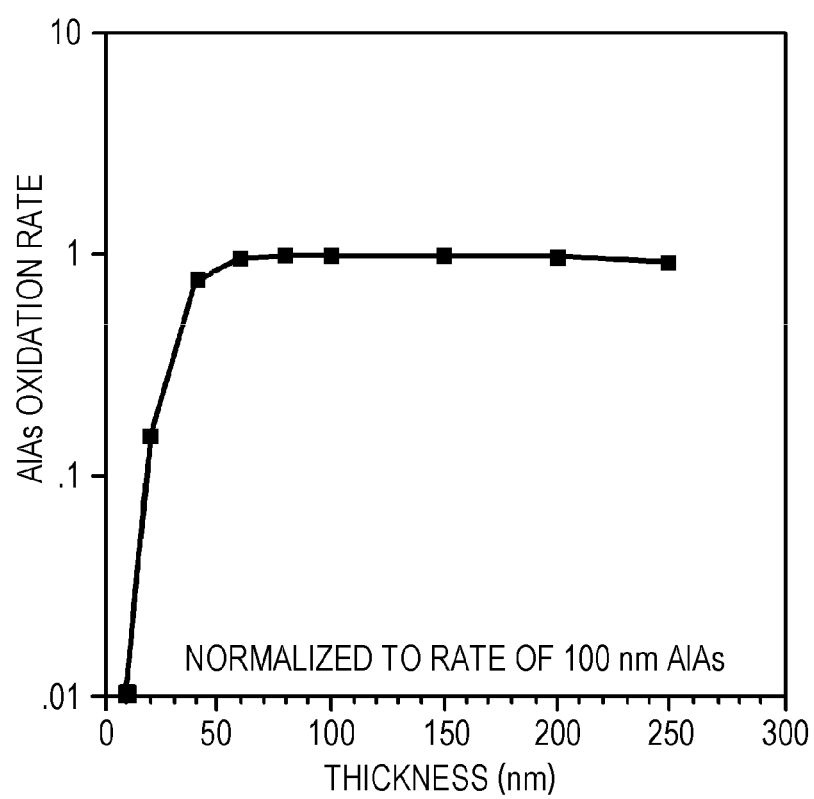
FIG. 4 is a graph illustrating the relationship between the oxidation rate in an AlAs layer and the thickness of the AlAs layer.

On the other hand, while the horizontal oxidation rate OX_H can be increased by increasing the thickness of the AlAs layer, if the difference between the horizontal oxidation rate OX_H and the vertical oxidation rate becomes excessively large, it becomes difficult to control the tapered portion K. FIG. 4 illustrates the relationship between the thickness of AlAs and oxidation rate (K. D. Choquette et al., "Advances in Selective Oxidation of AlGaAs Alloys", IEEE Journal of Selected Topics in Quantum Electronics, 1997, Vol. 3, pp. 916-926). The oxidation rate stops increasing when the thickness of the AlAs layer exceeds about 50 nm as illustrated in FIG. 4. If the AlAs layer has a thickness at which the oxidation rate stops increasing, it becomes impossible to control the tapered portion. Thus, the thickness of an AlAs layer that enables the tapered portion to be controlled is set at least 50 nm or less or about 50 nm or less. If the thickness of the AlAs layer is smaller than 10 nm, oxidation rate becomes excessively low, which makes it impossible to control the tapered portion. Thus, the thickness of the AlAs layer is set to at least 10 nm or more or about 10 nm or more.

Figure 5A:
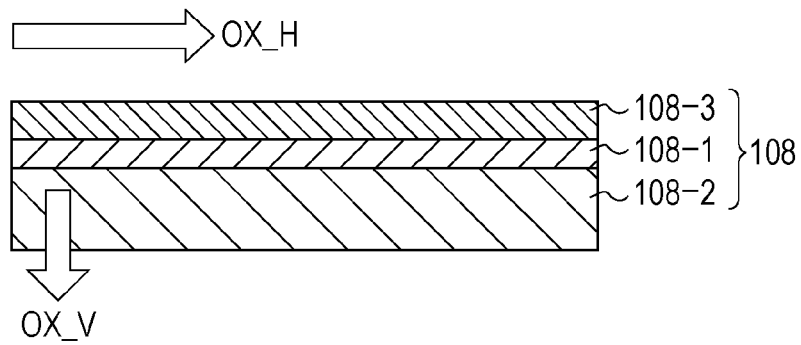
FIG. 5A illustrates an example of a current confinement layer according to an exemplary embodiment of the invention.
Figure 5B:
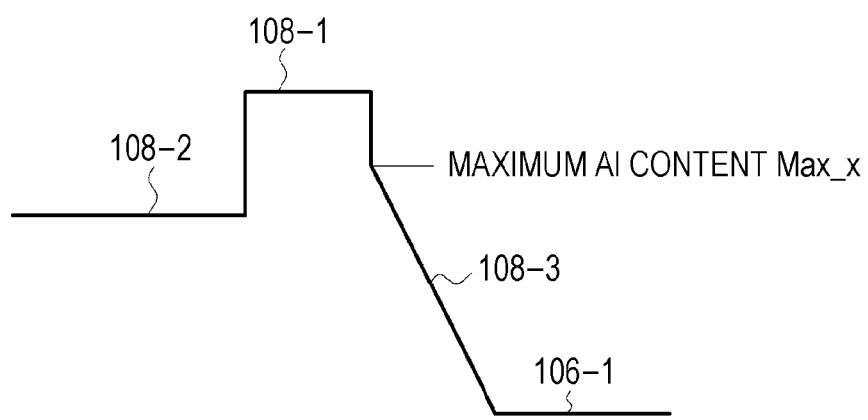
FIG. 5B illustrates the profile of the Al content in a current confinement layer according to an exemplary embodiment of the invention.
Figure 5C:
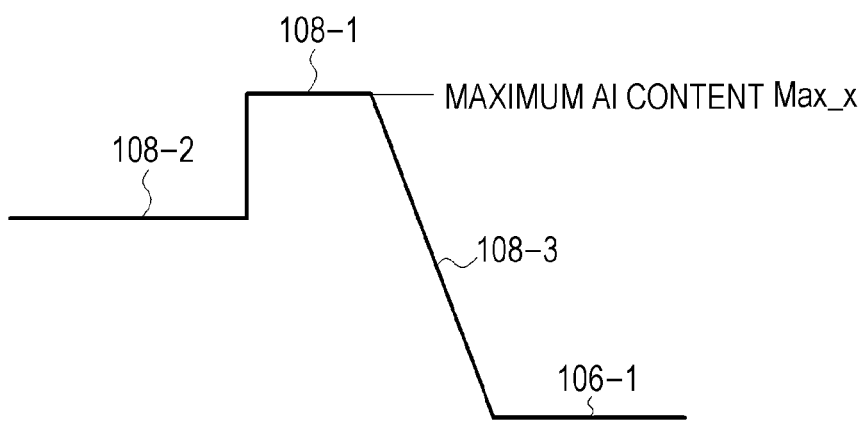
FIG. 5C illustrates the profile of the Al content in a current confinement layer prepared as a comparative example.

A method for controlling the tapered portion in the oxidized region when the current confinement layer 108 is constituted by three sublayers, that is, the high-oxidation-rate layer 108-1, the tapered-portion-forming layer 108-2, and the composition-gradient layer 108-3, is described below. FIG. 5A is a schematic cross-sectional view of a current confinement layer 108 constituted by the three sublayers. FIG. 5B illustrates the profile of the Al content in the current confinement layer 108 according to the exemplary embodiment. FIG. 5C is the profile of the Al content in the current confinement layer prepared as a comparative example.

The Al content in the composition-gradient layer 108-3 is gradually changed in order to reduce the electric resistance between the AlAs layer 108-1 and the $Al_{0.3}Ga_{0.7}As$ layer 106-1 that serves as a high-refractive-index layer of the upper DBR 106. In this exemplary embodiment, the Al content in a portion of the composition-gradient layer (i.e., $Al_xGa_{1-x}As$ layer) 108-3 which faces the AlAs layer, that is, the maximum Al content Max_x, is set lower than the Al content in the AlAs layer 108-1 as illustrated in FIG. 5B. In other words, there is a certain amount of gap, that is, discontinuity, between the Al content in the AlAs layer 108-1 and the maximum Al content Max_x in the composition-gradient layer 108-3. The minimum Al content Min_x in the composition-gradient layer 108-3 is set equal to the Al content in the high-refractive-index layer 106-1. In the example illustrated in FIG. 5B, where the high-oxidation-rate layer 108-1 is composed of AlAs, the maximum Al content Max_x in the composition-gradient layer 108-3 is set lower than 1.0 (e.g., about 0.96) and the minimum Al content Min_x is set to 0.3.

On the other hand, in the current confinement layer prepared as an comparative example, the Al content in a portion of the composition-gradient layer (i.e., $Al_xGa_{1-x}As$ layer) which faces the AlAs layer, that is, the maximum Al content Max_x, is set equal to the Al content in the high-oxidation-rate layer 108-1, and the minimum Al content Min_x is set equal to the Al content in the high-refractive-index layer 106-1 as illustrated in FIG. 5C. In the comparative example illustrated in FIG. 5C, where the high-oxidation-rate layer 108-1 is composed of AlAs, the maximum Al content Max_x in the composition-gradient layer is set to 1.0 and the minimum Al content Min_x is set to 0.3.

When the current confinement layer 108 including the composition-gradient layer 108-3 is oxidized, oxidation also proceeds from the high-oxidation-rate layer 108-1 to the composition-gradient layer 108-3 during oxidation. If the portion of the composition-gradient layer which faces the AlAs layer has the same Al content as the AlAs layer as in the comparative example, the thickness of the high-oxidation-rate layer is slightly increased, and accordingly the oxidation rate OX_V in the vertical direction (i.e., direction in which the semiconductor layers are stacked) toward the composition-gradient layer is increased. As a result, it becomes practically impossible to control the thickness of the high-oxidation-rate layer in a sufficient manner, which makes it difficult to control the tapered portion K. In contrast, in this exemplary embodiment, the Al content in the portion of the composition-gradient layer 108-3 which faces the high-oxidation-rate layer, that is, Max_x, is set lower than the Al content in the high-oxidation-rate layer 108-1, which makes it possible to set the thickness of the high-oxidation-rate layer 108-1 as determined by the deposition conditions. Therefore, there is no risk that the oxidation rate OX_V in the vertical direction (i.e., direction in which the semiconductor layers are stacked) toward the composition-gradient layer 108-3 is increased due to the composition-gradient layer 108-3, which enhances ease of controlling the tapered portion K.

Figure 6:
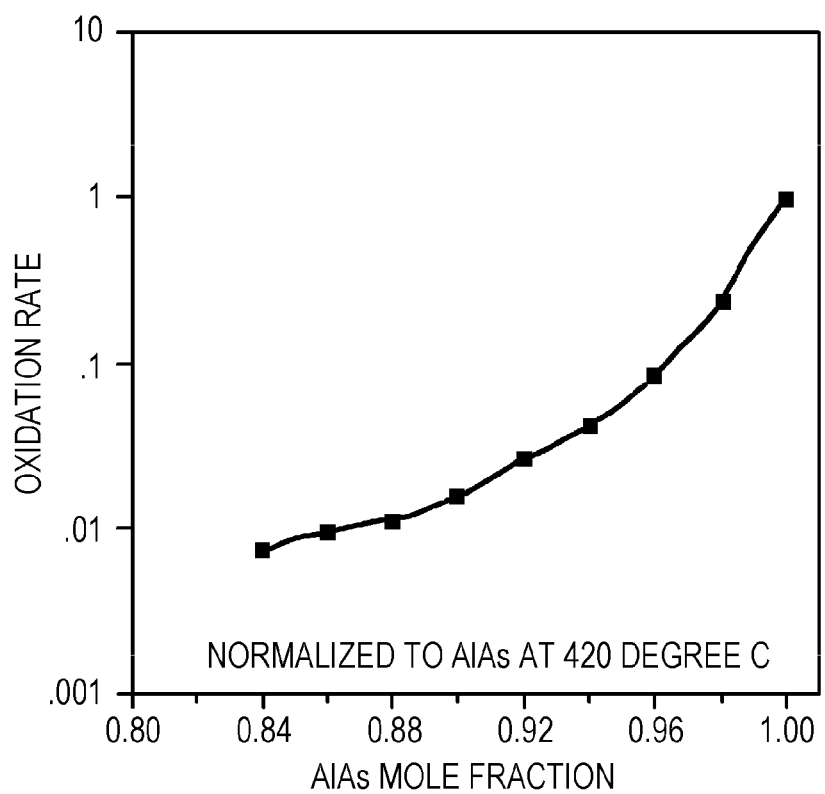
FIG. 6 is a graph illustrating the relationship between Al content and oxidation rate.

FIG. 6 is a graph illustrating the relationship between Al content and oxidation rate, where the value of oxidation rate measured when the Al content is 1 is taken as unity. Although the difference in Al content between AlAs and $Al_{0.96}Ga_{0.04}As$ is only about 4%, the oxidation rates in AlAs and $Al_{0.96}Ga_{0.04}As$ differ by one order of magnitude. When the high-oxidation-rate layer 108-1 is composed of $Al_{0.98}Ga_{0.02}As$, setting the Al content in the portion of the composition-gradient layer 108-3 which faces the AlAs layer to about 91% to 92% causes a difference in oxidation rate by one order of magnitude to be made. The difference in the maximum Al content Max_x in the composition-gradient layer 108-3 and the Al content in the high-oxidation-rate layer 108-1 is preferably set to 1% to 3% and is more preferably set such that oxidation rate is reduced by about one order of magnitude. For example, in the case where the high-oxidation-rate layer 108-1 is an AlAs layer, the maximum Al content Max_x in the composition-gradient layer 108-3 is set to about 0.96. In the case where the high-oxidation-rate layer 108-1 is composed of $Al_{0.98}Ga_{0.02}As$, the maximum Al content Max_x in the composition-gradient layer 108-3 is set to about 0.91. When the oxidation rate in the composition-gradient layer is lower than that in the high-oxidation-rate layer by about one order of magnitude, the negative impact of vertical oxidation rate OX_V due to the composition-gradient layer becomes negligibly low.

In the case where the maximum Al content Max_x in the composition-gradient layer is set equal to the Al content in the high-oxidation-rate layer as in the comparative example, the thickness of the high-oxidation-rate layer is virtually increased, which increases the oxidation rate OX_V in the vertical (i.e., thickness) direction. Thus, even when the thickness of the high-oxidation-rate layer is precisely controlled, the thickness of the high-oxidation-rate layer may be changed due to the composition-gradient layer, which increases the vertical oxidation rate OX_V and consequently deteriorates ease of controlling the tapered portion K. On the other hand, as in the exemplary embodiment, forming a composition-gradient layer 108-3 having an Al content lower than that in the high-oxidation-rate layer 108-1 by a few percent enables the oxidation rate OX_V in the high-oxidation-rate layer 108-1 in the vertical (i.e., thickness) direction to be controlled with accuracy only by changing the thickness of the high-oxidation-rate layer 108-1. This increases ease of controlling the tapered portion.

When the Al content is lower than about 0.9, oxidation rate substantially stops decreasing at about 0.01 as illustrated in FIG. 6. Therefore, setting the maximum Al content Max_x in the composition-gradient layer 108-3 to 0.90 or less or about 0.90 or less enables the vertical oxidation rate OX_V to be stabilized in a more consistent manner. An increase in the difference in Al content between the composition-gradient layer 108-3 and the high-oxidation-rate layer 108-1 results in an increase in element resistance, which may lead to, for example, a reduction in output due to heat generation. However, by limiting the difference in Al content to about a few percent, it is possible to increase ease of controlling the tapered portion while minimizing the increase in element resistance.

If the high-oxidation-rate layer 108-1 has a larger thickness than the tapered-portion-forming layer 108-2, the tapered portion may be limited by the thickness of the tapered-portion-forming layer 108-2, which reduces the ease of controlling the tapered portion. Therefore, the thickness of the high-oxidation-rate layer 108-1 is set smaller than the thickness of the tapered-portion-forming layer 108-2 in order to increase the ease of controlling the tapered portion.

An exemplary method for producing the current confinement layer according to the exemplary embodiment is described below. A VCSEL is produced by metal-organic chemical vapor deposition (MOCVD). The VCSEL includes an n-type GaAs substrate 100, an n-type lower DBR 102, an active region 104, and a p-type upper DBR 106 that are stacked on top of one another in order. The thicknesses of sublayers constituting the DBRs are each set equal to a quarter of the wavelength in the medium.

Subsequent to deposition of the active region 104, a current confinement layer 108 is deposited on the active region 104. In the case where a steep composition gradient is to be formed in a portion of a composition-gradient layer 108-3 constituting the current confinement layer which faces the AlAs layer, trimethylaluminium (TMAl) and trimethylgallium (TMGa) are used as Group-III raw materials. When a mixed crystal of AlAs and GaAs, such as AlGaAs, is formed, the Al/Ga compositional ratio can be controlled by changing the ratio of the flow rates of the Group-III raw materials. In order to form AlAs, TMAl is used as a Group-III raw material. In order to form GaAs, TMGa is used as a Group-III raw material. In order to form AlGaAs, both TMAl and TMGa are used. The flow rates of raw material gases can be controlled using a mass flow controller. In order to form a steep composition gradient, it is necessary to instantly change the flow rate of each raw material gas to a specific flow rate corresponding to the Al content in the layer to be deposited next at a boundary at which the layer to be deposited is switched.

FIG. 7 illustrates a flowchart of a process for depositing the current confinement layer. When a tapered-portion-forming layer 108-2 is deposited on the active region 104 (S100), only TMAl is charged into a process chamber as a Group-III raw material for depositing an AlAs layer. Thus, deposition of the AlAs layer begins (S102). The thickness of the AlAs layer is controlled by changing the length of time for which the raw-material gas is supplied. Therefore, the deposition of the AlAs layer is terminated when the length of AlAs-deposition time reaches a predetermined length (S104). Subsequently, deposition of a composition-gradient layer 108-3 begins. In this exemplary method, the maximum Al content Max_x in the composition-gradient layer is set to 0.95. TMAl and TMGa are charged into the process chamber as Group-III raw materials. The ratio of the flow rates of the Group-III raw material gases is controlled such that the Al content gradually changes from 0.95 to 0.30 (S106). When the length of time for which the composition-gradient layer is deposited reaches a predetermined length, the deposition of the composition-gradient layer is terminated (S108). Subsequently, deposition of a high-refractive-index layer 106-1 constituting the upper DBR 106 begins (S110).

While the current confinement layer is formed as the bottom layer of the upper DBR in the above-described exemplary embodiment, the current confinement layer may be formed inside the lower DBR. The current confinement layer may optionally include one or a few AlGaAs layers interposed between the current confinement layer and the active region as long as the angle of divergence can be controlled.

While a mesa is formed above the substrate and the current confinement layer is selectively oxidized from the side surfaces of the mesa in the above-described exemplary embodiment, it is not always necessary to form the mesa. For example, plural circular holes may be formed in the direction from the upper DBR to the lower DBR, and the current confinement layer exposed through the plural holes may be selectively oxidized. The plural holes are arranged along the circumference of a circle centered around the optical axis. The oxidized regions formed around the respective holes are linked with one another to form one oxidation aperture.

While a surface-emitting semiconductor laser including an AlGaAs-based compound semiconductor layer is described as an example in the above-described exemplary embodiment, the exemplary embodiment according to the invention may also be applied to light-emitting devices including other types of compound semiconductor layers. While a single-spot surface-emitting semiconductor laser is described as an example in the above-described exemplary embodiment, the exemplary embodiment according to the invention may also be applied to a multi-spot surface-emitting semiconductor laser array including plural light-emitting portions (i.e., mesas) formed on a substrate.

Figure 8A:
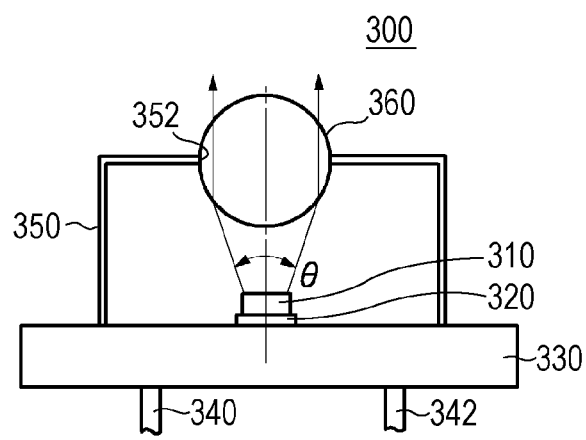
FIGS. 8A and 8B are schematic cross-sectional views of surface-emitting semiconductor laser devices that include a surface-emitting semiconductor laser according to an exemplary embodiment of the invention and an optical component.

Next, a surface-emitting semiconductor laser device, an optical information processing device, and an optical transmission device that include the VCSEL according to the exemplary embodiment of the invention are described with reference to the attached drawings. FIG. 8A is a cross-sectional view of a surface-emitting semiconductor laser device in which the VCSEL and an optical element are packaged. In the surface-emitting semiconductor laser device 300, a chip 310 including the VCSEL disposed thereon is fixed to a disk-shaped metal stem 330 with a conductive adhesive 320. Conductive leads 340 and 342 are inserted into through-holes (not illustrated in the drawing) formed in the stem 330. The lead 340 is electrically connected to the n-side electrode of the VCSEL, and the lead 342 is electrically connected to the p-side electrode of the VCSEL.

A rectangular hollow cap 350 is fixed to the stem 330 including the chip 310. An optical element, such as a ball lens 360, is fixed inside an opening 352 formed at the center of the cap 350. The optical axis of the ball lens 360 is positioned so as to be aligned with substantially the center of the chip 310. When a forward voltage is applied between the leads 340 and 342, the chip 310 emits a laser beam in the vertical direction. The distance between the chip 310 and the ball lens 360 is controlled such that the ball lens 360 is positioned within a region corresponding to the angle θ of divergence of the laser beam emitted by the chip 310. Optionally, a photodetector or a temperature sensor may be disposed inside the cap in order to monitor the light-emitting state of the VCSEL.

Figure 8B:
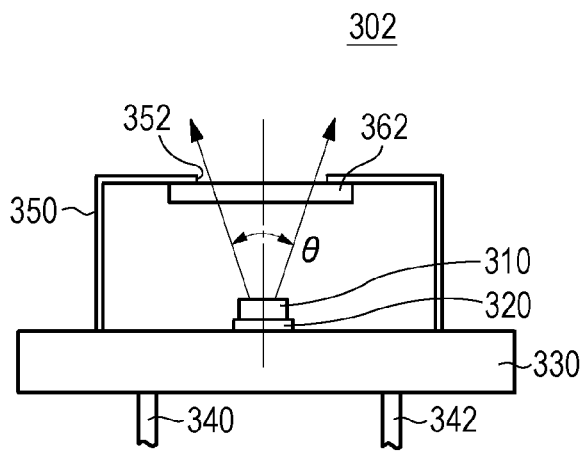

FIG. 8B illustrates the structure of another surface-emitting semiconductor laser device. A surface-emitting semiconductor laser device 302 illustrated in FIG. 8B includes a flat glass 362 instead of the ball lens 360. The flat glass 362 is fixed inside the opening 352 formed at the center of the cap 350. The flat glass 362 is positioned such that the center of the flat glass 362 is substantially aligned with the center of the chip 310. The distance between the chip 310 and the flat glass 362 is controlled such that the diameter of the opening of the flat glass 362 entirely covers a region corresponding to the angle θ of divergence of the laser beam emitted by the chip 310.

Figure 9:
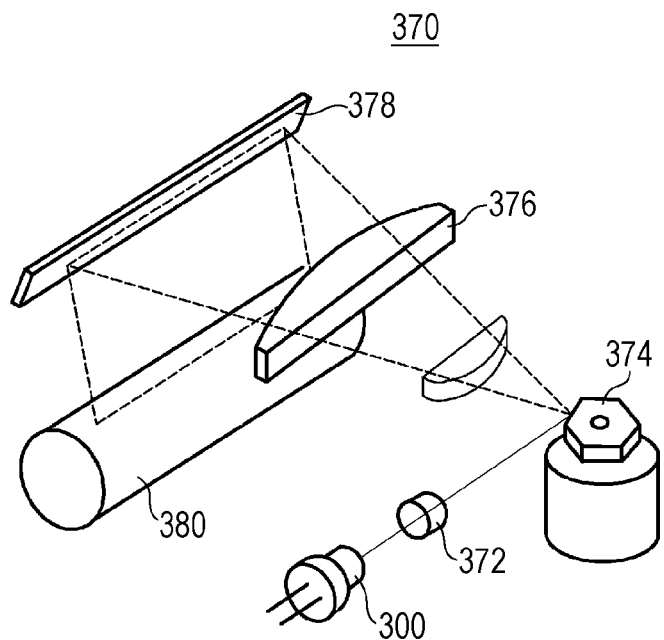
FIG. 9 illustrates an example of an information processing device that includes a surface-emitting semiconductor laser according to an exemplary embodiment of the invention which serves as a light source device.

FIG. 9 illustrates an example of an optical information processing device that includes the VCSEL serving as a light source. An optical information processing device 370 includes the surface-emitting semiconductor laser device 300 or 302 including the VCSEL packaged therein as illustrated in FIG. 8A or 8B; a collimator lens 372 through which a laser beam emitted by the surface-emitting semiconductor laser device 300 or 302 enters; a polygon mirror 374 that rotates at a constant speed and reflects a bundle of light beams, which is passed through the collimator lens 372, at a certain angle of divergence; an fθ lens 376 through which the laser beam reflected by the polygon mirror 374 enters and enables a reflecting mirror 378 to be irradiated with the laser beam; a linear reflecting mirror 378; and a photoreceptor drum (i.e., recording medium) 380 on which a latent image is formed on the basis of the light reflected by the reflecting mirror 378. The VCSEL according to the exemplary embodiment of the invention may be used as a light source of an optical information processing device, such as a copying machine or a printer, that includes an optical system that condenses a laser beam emitted by the VCSEL on a photoreceptor drum and a mechanism that scans the photoreceptor drum with the condensed laser beam.

Figure 10:
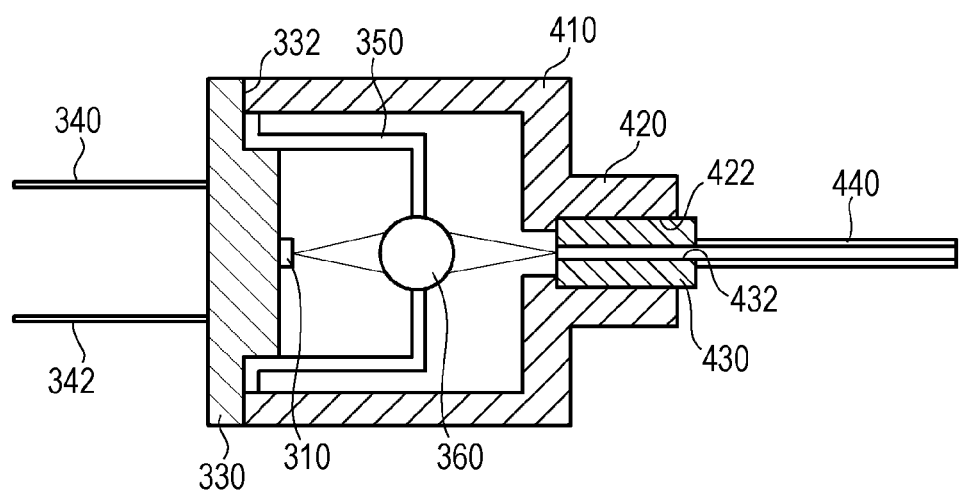
FIG. 10 is a schematic cross-sectional view of an optical transmission device that includes a surface-emitting semiconductor laser according to an exemplary embodiment of the invention.

FIG. 10 is a cross-sectional view of an optical transmission device that includes the surface-emitting semiconductor laser device illustrated in FIG. 8A. An optical transmission device 400 includes a stem 330; a cylindrical housing 410 fixed to the stem 330; a sleeve 420 integrally formed at an end of the housing 410; a ferrule 430 held inside an opening 422 formed in the sleeve 420; and an optical fiber 440 held by the ferrule 430. A flange 332 is formed on the stem 330 in the circumferential direction. The other end of the housing 410 is fixed to the flange 332. The ferrule 430 is precisely positioned inside the opening 422 of the sleeve 420, and thereby the optical axis of the optical fiber 440 is aligned with the optical axis of the ball lens 360. A core wire of the optical fiber 440 is held inside a through-hole 432 formed in the ferrule 430.

A laser beam emitted from the surface of the chip 310 is condensed by the ball lens 360, and the condensed light enters the core wire of the optical fiber 440 and is thereby transmitted. Although the ball lens 360 is used in the above example, lenses other than a ball lens, such as a biconvex lens and a planoconvex lens, may also be used instead. The optical transmission device 400 may optionally include a driving circuit that applies an electric signal between the leads 340 and 342. The optical transmission device 400 may optionally include a receiving unit that receives an optical signal via the optical fiber 440.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A surface-emitting semiconductor laser comprising:
a first semiconductor multilayer film reflector;
an active region;
a second semiconductor multilayer film reflector; and
a current confinement layer including an oxidized region formed by selective oxidation,
wherein the current confinement layer includes
a first semiconductor layer having a relatively high Al content,
a second semiconductor layer adjacent to the first semiconductor layer, the second semiconductor layer being disposed on an active-region side of the first semiconductor layer, the second semiconductor layer having a lower Al content than the first semiconductor layer, and
a composition-gradient layer adjacent to the first semiconductor layer, the composition-gradient layer being disposed on a side of the first semiconductor layer which is opposite to the active-region side on which the second semiconductor layer is disposed, and
wherein a portion of the composition-gradient layer which faces the first semiconductor layer has a lower Al content than the first semiconductor layer such that there is a discontinuity between the Al content in the first semiconductor layer and a maximum Al content in the composition-gradient layer in the portion of the composition-gradient layer.

2. The surface-emitting semiconductor laser according to claim 1,
wherein a difference in Al content between the portion of the composition-gradient layer which faces the first semiconductor layer and the first semiconductor layer is made such that an oxidation rate in the composition-gradient layer is lower than an oxidation rate in the first semiconductor layer by about one order of magnitude.

3. The surface-emitting semiconductor laser according to claim 1,
wherein the portion of the composition-gradient layer which faces the first semiconductor layer has an Al content of about 0.90 or less.

4. The surface-emitting semiconductor laser according to claim 1,
wherein the second semiconductor layer is adjacent to the active region.

5. The surface-emitting semiconductor laser according to claim 1,
wherein the composition-gradient layer is adjacent to a high-refractive-index layer constituting the second semiconductor multilayer film reflector, and
wherein an Al content in the composition-gradient layer is reduced to an Al content substantially equal to an Al content in the high-refractive-index layer.

6. The surface-emitting semiconductor laser according to claim 1,
wherein the first semiconductor layer is composed of AlAs.

7. The surface-emitting semiconductor laser according to claim 1,
wherein the first semiconductor layer has a thickness of about 10 nm or more to about 50 nm or less.

8. A surface-emitting semiconductor laser device comprising:
the surface-emitting semiconductor laser according to claim 1; and
an optical element that light emitted by the surface-emitting semiconductor laser enters.

9. An optical transmission device comprising:
the surface-emitting semiconductor laser device according to claim 8; and
a transmission unit that transmits a laser beam emitted by the surface-emitting semiconductor laser device via an optical medium.

10. An information processing device comprising:
the surface-emitting semiconductor laser according to claim 1;
a light-condensing unit that condenses a laser beam emitted by the surface-emitting semiconductor laser on a recording medium; and
a mechanism that scans the recording medium with the laser beam condensed by the light-condensing unit.

* * * * *